US008611557B2

(12) United States Patent
Oxford et al.

(10) Patent No.: US 8,611,557 B2
(45) Date of Patent: Dec. 17, 2013

(54) METHOD AND APPARATUS FOR AUDIO PROCESSING

(76) Inventors: J. Craig Oxford, Nashville, TN (US); D. Michael Shields, St. Paul, MN (US)

( * ) Notice: Subject to any disclaimer, the term of this patent is extended or adjusted under 35 U.S.C. 154(b) by 1249 days.

(21) Appl. No.: 12/193,036

(22) Filed: Aug. 17, 2008

(65) Prior Publication Data

US 2009/0046871 A1 Feb. 19, 2009

Related U.S. Application Data

(60) Provisional application No. 60/956,584, filed on Aug. 17, 2007.

(51) Int. Cl.
*H03G 5/00* (2006.01)

(52) U.S. Cl.
USPC ................ 381/98; 700/94; 381/320; 381/314

(58) Field of Classification Search
USPC ............................................ 381/32, 314, 320
See application file for complete search history.

(56) References Cited

U.S. PATENT DOCUMENTS

| | | | | |
|---|---|---|---|---|
| 3,881,057 | A * | 4/1975 | Adachi et al. | 381/63 |
| 5,109,419 | A * | 4/1992 | Griesinger | 381/63 |
| 6,140,822 | A * | 10/2000 | Williams | 324/620 |
| 2002/0051549 | A1* | 5/2002 | Uvacek et al. | 381/312 |

* cited by examiner

*Primary Examiner* — David Vu
*Assistant Examiner* — Jonathan Han
(74) *Attorney, Agent, or Firm* — W. Edward Ramage; Baker Donelson

(57) ABSTRACT

A method and apparatus for introducing a time-varying time delay randomly into the individual reproduction channels of a sound recording, two in the case of binaural presentation. This emulates the temporal aspect of microphone and/or listener motion. The present invention may be applied as a unidirectional process. No preparation of the source material is required. It can be applied to any multichannel audio signal set. It can process analog or digital signals. The process may be used with headphones, loudspeakers, hearing aids or similar assistive hearing devices.

19 Claims, 4 Drawing Sheets

METHOD AND APPARATUS FOR AUDIO PROCESSING

This application claims priority to Provisional Patent Application No. 60/956,584, filed Aug. 17, 2007, entitled "Method and Process for Audio Processing," and is entitled to that filing date, in whole or in part, for priority. The complete disclosure, specification, drawings and attachments of Provisional Patent Application No. 60/956,584 are incorporated herein in their entirety by reference.

FIELD OF INVENTION

This invention relates to a method and process of processing audio signals for the purpose of improved recognition of timbre. More particularly, this invention relates to a method and process for temporally modifying audio signals by simulation of missing reverberant cues.

BACKGROUND OF INVENTION

Timbre is generally defined as the tonal identity of a sound. It is the attribute that distinguishes a sound from other sounds of the same pitch and intensity. While the term is most commonly used in a musical connotation, timbre is important in other ways because it is a fundamental aspect of the importance of a sound in the hierarchy of threat or alarm.

In the presentation of music, it can be far more important to quickly identify what the sound is than where it is. This distinction is both intellectual and intuitive; intellectually, timbre is critical to being able to unravel the musical texture in order to understand it. Intuitively, timbre is a fundamental input to the limbic nervous system which is the seat of emotional response. If timbre cannot be quickly perceived, then the musical texture cannot be decoded, nor can an emotional response be elicited. Conscious effort to "understand" the sound impedes the possibility of viscerally reacting to it. The ability to viscerally react to music is an important element of therapeutic effectiveness in music therapy. Basically, improvement in timbre perception allows the conscious thought process to be bypassed.

When a recording is made with the microphones or the performers (or both) in motion, upon playback musical timbre can be more quickly identified. It is hypothesized that this is due to an interaction with human hearing which allows a spatial average energy spectrum to be developed by a process which is in lieu of, or possibly in addition to, the usual averaging of reflections by the human neurophysiological system.

This effect is particularly apparent in headphone (binaural) reproduction. Presumably this is because in normal (non-headphone) listening to either live or reproduced sound, there are small head motions of the listener constantly occurring. And with loudspeakers, even though listener's head may be able to make small movements, the source of the sound is fixed. This may enable the listener to develop the aforementioned spatial average estimate of the energy spectrum. In headphone listening, however, this mechanism is not available because there is no relative motion possible between the listener's ears and the sound source. There also are several other problems associated with binaural presentation, chief among which is the sensation that the sound image is in the middle of one's head. Also there are questions concerning the basic frequency response as it relates to diffuse-field versus direct field equalization.

Accordingly, what is needed is a method to process audio signals to restore or simulate this perceptual mechanism with the use of headphones or loudspeakers.

SUMMARY OF THE INVENTION

In various embodiments, the present invention introduces temporal variation in the effective path from the musician to the listener to aid in perception of timbre. Modification of the electrical or acoustical phase of a signal is the same as a time variation (i.e., phase is time). In addition, a wave propagating in a medium requires a particular amount of time to travel a particular distance; hence, time also is distance. It follows that phase is (or can be correlated to) distance.

In one exemplary embodiment, the present invention introduces a time-varying time delay randomly introduced into the individual reproduction channels, two in the case of binaural presentation. This emulates the temporal aspect of microphone and/or listener motion. The present invention may be applied as a unidirectional process. No preparation of the source material is required. It can be applied to any multi-channel audio signal set. It can process analog or digital signals.

DETAILED DESCRIPTION OF EXEMPLARY EMBODIMENTS

In one exemplary embodiment, the present invention enhances the perception of timbre, or tonal identity, by temporal processing of a recording. The recording may be a fixed-microphone recording. The recording can be analog or digital. While the enhancement of the perception of timbre may be accomplished by introducing a time-varying time delay, it may also be accomplished by suitable phase shifting.

A sound traveling in a medium (e.g., air) has a wavelength which is inversely proportional to its frequency. The velocity of propagation (e.g., distance/unit time) in the medium is constant, therefore a given number of degrees (e.g., phase angle) of wave movement requires an amount of time which is also inversely proportional to frequency. Thus phase and time and distance are related.

Whether the time delays are implemented as pure delay or as phase shifting, it is necessary to make a quantitative estimate of the amount of delay which is required. A motion of the microphones of, say, 0.2 m would be represented by a time shift of about 600 microseconds, using the formula $T=r/c$, where $c$=speed of sound=354 m/s, and $r$=distance in m.

In one embodiment, the method of the present invention introduces a random time-varying phase shift, which is free of discontinuities, independently into the channels of a stereophonic electrical signal path. For example, a time-varying phase shift is introduced independently and randomly into the two channels of a stereophonic signal path. The method is not necessarily limited to two channels. The result emulates at least one aspect of the continuous movement of the recording microphones mentioned above.

Figure 1:
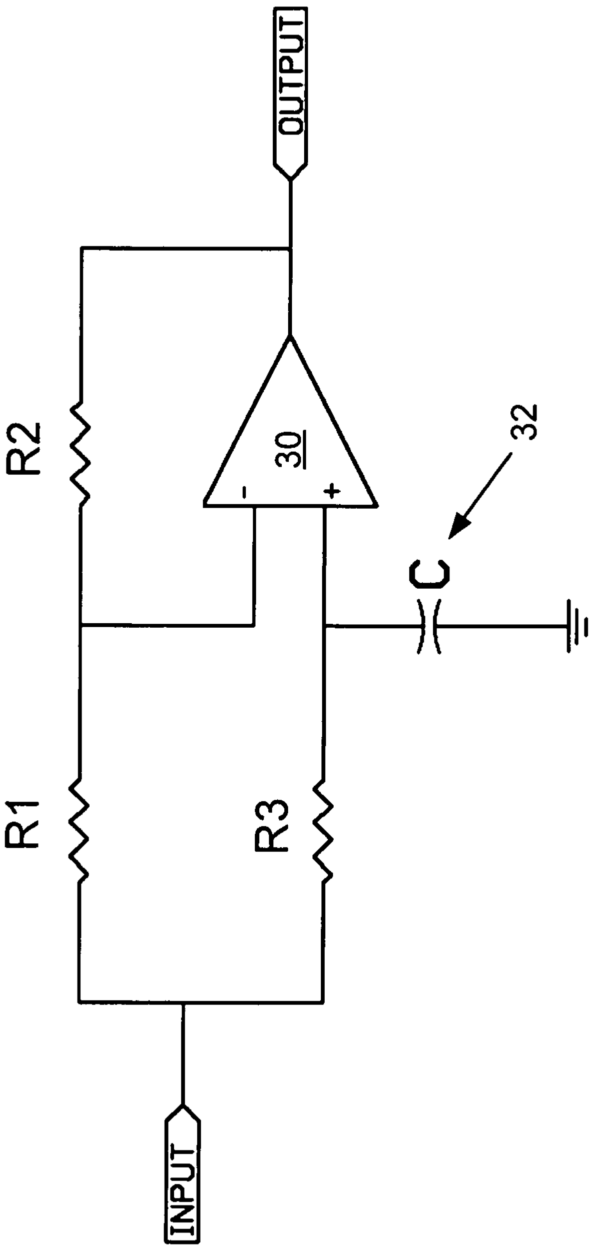
FIG. 1 is a diagram of a fixed phase shifter circuit in accordance with an exemplary embodiment of the present invention.

At middle frequencies, 1 kHz, 600 usec corresponds to 216 degrees of phase delay. An example of a fixed phase shifting circuit is illustrated in FIG. 1, where R1 through R3 are resistors and C is a capacitor 32. The circuit further comprises an operational amplifier 30. The resistance values may vary. In one exemplary embodiment, the values of R1 and R2 are equal or approximately equal. Such a circuit will produce phase shift of 0-180 degrees or 180-360 degrees depending on how it is configured. A relatively uniform delay of 600 usec requires 2160 degrees at 10 kHz, so a cascade of such phase shifters is required. Experimentally, it is not necessary to preserve a constant delay time at all frequencies. This can lead to a reduction in the number of stages required.

Figure 2:
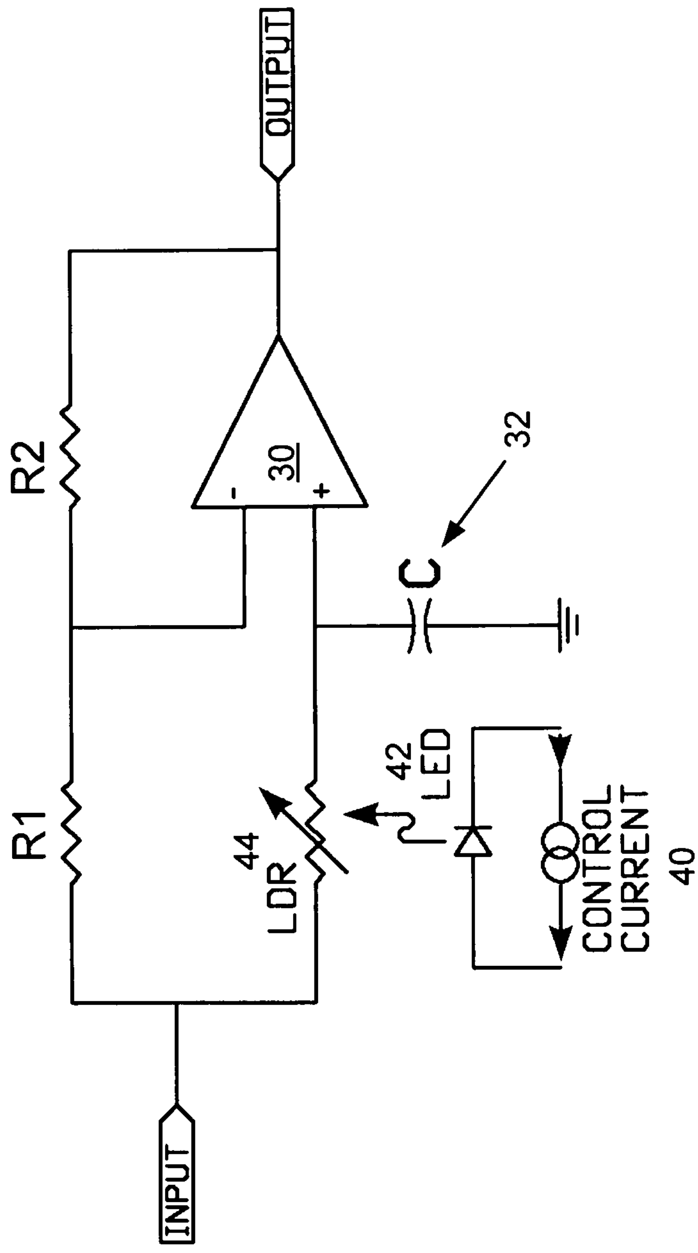
FIG. 2 is a diagram of a variable phase shifter circuit in accordance with an exemplary embodiment of the present invention.

In one embodiment, the phase shifter circuit should be variable according to some external control parameter. In FIG. 2, an embodiment of a variable phase shifter circuit is shown in which an external current 40 controls the phase shift by means of a light-emitting diode 42 which impacts a late dependent resistor 44 so that the resistance varies with varying light emission from the LED. A common voltage controlling several such circuit elements in a cascade produces the required controllable phase-shifter.

Other higher-order (i.e. quadratic) phase shifters could be used. Even analog charge-coupled delay lines could be used with a time-varying clock.

In yet another embodiment, the invention comprises a goniometer, a circuit or device that changes phase continuously, i.e., not in steps. Effectively, the circuit is a phase modulator with two inputs: a modulation input and a signal input. There may be one such goniometer in each signal channel. The modulation input to each goniometer is an independent source of random noise in a control bandwidth chosen to simulate a physically possible movement of the microphones on the order of 0.1 Hz to 1 Hz.

Figure 3:
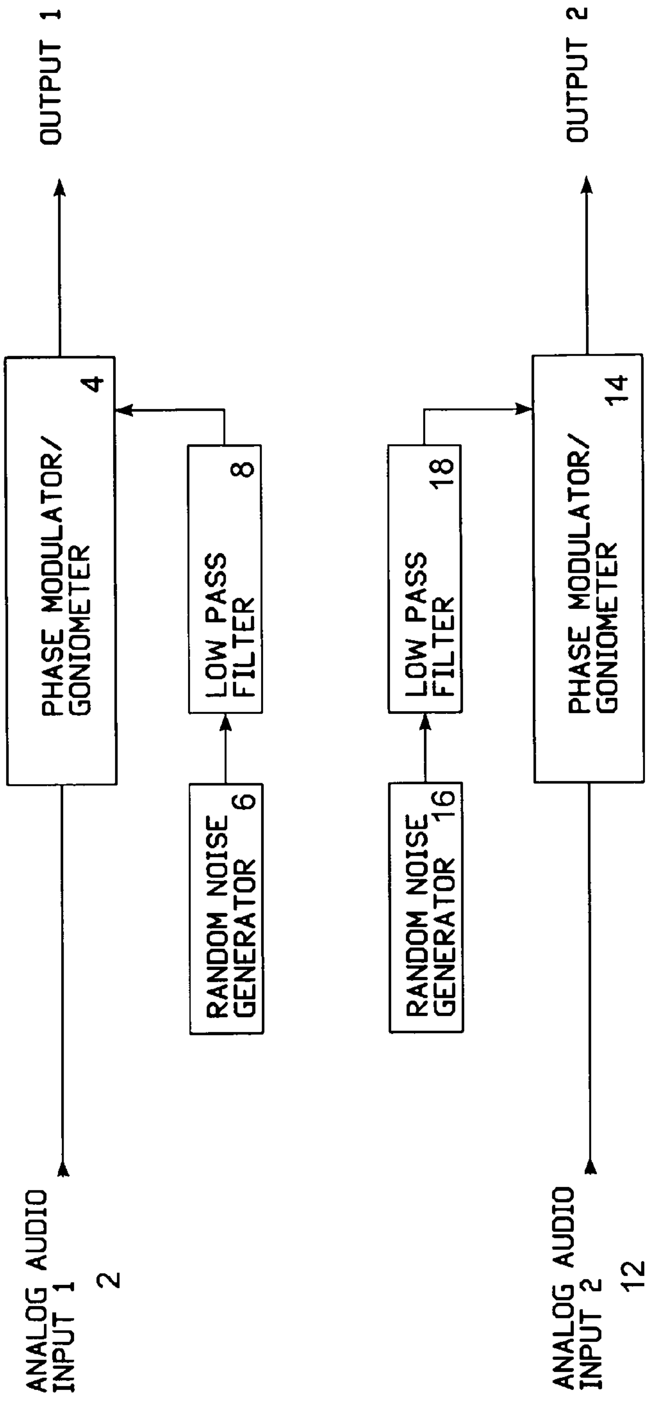
FIG. 3 is a diagram of an analog audio processing system in accordance with an exemplary embodiment of the present invention.

FIG. 3 shows one embodiment of an analog audio processor in accordance with the present invention for a two-channel system. The analog audio signals 2, 12 are applied to two corresponding phase modulator/goniometer circuits or devices 4, 14. These goniometers may be voltage-controlled phase shifters as described above. Two random noise or number generators 6, 16 with suitable low-pass filters 8, 18 provide the random control function.

In a digital embodiment, the audio signal is first digitized and then passed in each channel though a delay which is phase-continuously varied according to a random law at an appropriate rate. This technique is similar to that used in direct-digital-synthesis oscillators. The signal is then reconverted to analog for presentation via headphones or loudspeakers. It should be understood that variation in the phase or time delays, the rate or law controlling such delays and the exact circuit embodiments may vary.

Figure 4:
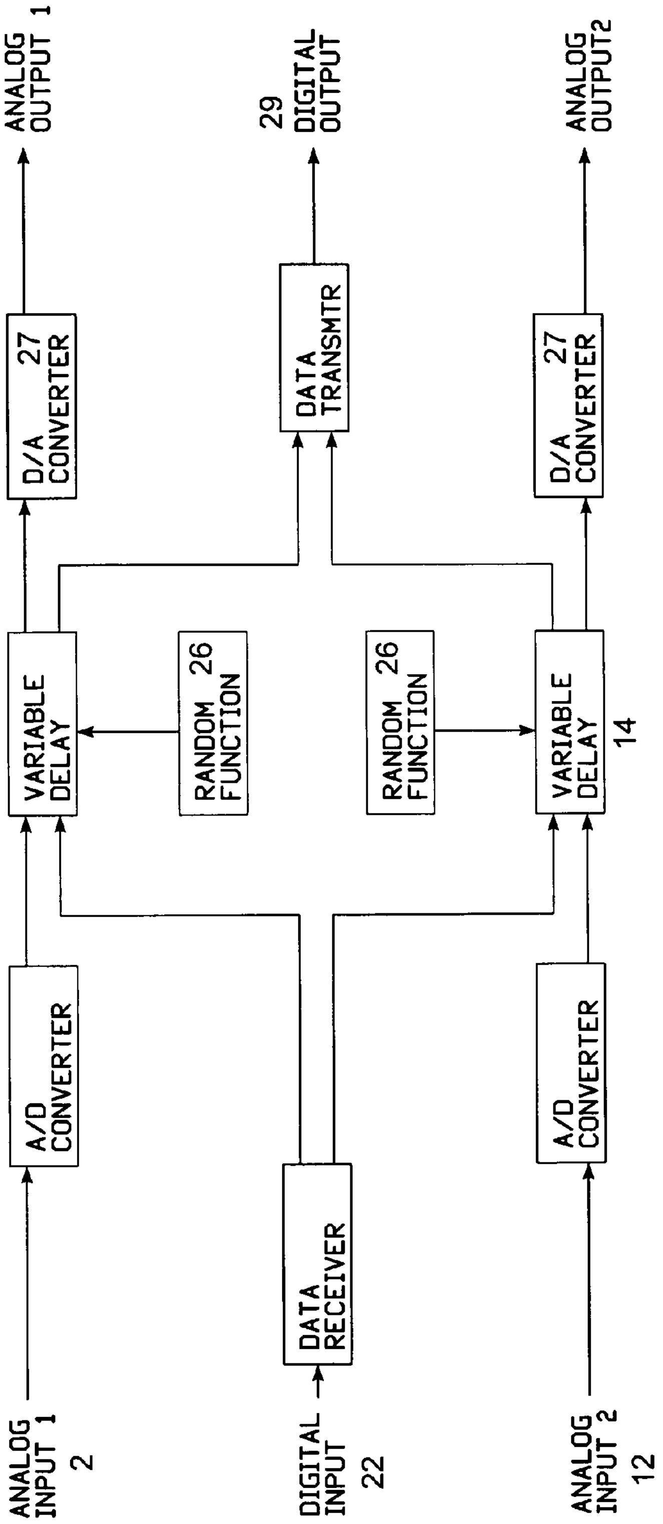
FIG. 4 is a diagram of an analog and digital audio processing system in accordance with an exemplary embodiment of the present invention.

FIG. 4 shows an embodiment for a system that can process digital sound recordings and analog sound recordings. The input can be two analog signals 2, 12 which are converted to digital by digital/analog converters, or a digital input 22 which may be multiplexed. The application of pure delay is straightforward, using goniometer circuits as described above with digital random number generators 26. The delay may be smoothly varied. For example, a DDS clock with continuous phase interpolation can be used to operate a delay memory with the process at a sufficiently high rate that discontinuities will be absorbed in the output reconstruction filters. Output may be digital 29, or may be converted to analog by digital/analog converters 27 in each channel.

The control function is a random or pseudo-random time-varying quantity which controls the phase shifters or delay lines. The rate of variation in this embodiment should be in the range of probable motions of the listener or the microphones. Also, the rate of variation should be low enough that any phase-modulation sidebands will lie below the audio range so as to avoid the intrusion of low-frequency noise. In one exemplary embodiment, a control bandwidth of about 10 Hz is chosen. Because the bandwidth is so low, the random control function could be equally well generated by a true random noise source 6, 16, or by a random-number generator, with a suitable low-pass filter 8, 18.

In another embodiment, the phase/time variation should be smooth. Step discontinuities may produce audible artifacts. The range of the phase variation is adjustable. The variation should be free of patterns; that is, truly random and not cyclic.

Accordingly, the present invention restores the lost perceptual mechanism derived from relative motions between the source and the listener. The quickness of timbre recognition also may lead to an improvement in intelligibility of all signal types. This comports with the principles of quantitative intelligibility measures such as the Speech Transmission Index which deal with preservation of the infrasonic amplitude modulation transfer function.

Another area of binaural reproduction is the perception of the location of sounds in both azimuth and elevation. This is important in virtual-reality presentations and in information delivery systems, such as fighter plane cockpits. These systems usually concern themselves with stereotactic detection of head position, eye-motion tracking or other measures of directional attention in order to process audio messages in amplitude and phase to force the auditory image to be congruent with head position or visual attention.

The methods and processes of the present invention can be combined with these processes. For example, one way the "in the head" problem in binaural listening can be addressed is by filtering and cross-feeding the left and right signals according to generalized head-related transfer functions (HRTF). The HRTF models the propagation of sound around the head from ear-to-ear for external sound sources. This is another example of a process which is applied to replace a naturally-occurring aspect of hearing when binaural presentation is involved. The HRTF may be dynamically modified with a variable delay as described above.

The method and processes of the present invention also may be combined with assistive hearing devices, such as hearing aids, to improve intelligibility of what is heard through improved recognition of timbre.

Thus, it should be understood that the embodiments and examples described herein have been chosen and described in order to best illustrate the principles of the invention and its practical applications to thereby enable one of ordinary skill in the art to best utilize the invention in various embodiments and with various modifications as are suited for particular uses contemplated. Even though specific embodiments of this invention have been described, they are not to be taken as exhaustive. There are several variations that will be apparent to those skilled in the art.

We claim:

1. A method for processing an audio signal, comprising the steps of:

receiving the audio signal input;

introducing a time-varying time delay or phase shift into the audio signal input to produce a modified audio signal emulating relative motion between a source and a listener; and outputting the modified audio signal through a sound reproduction device that is fixed in distance with respect to the listener.

2. The method of claim 1, wherein the audio signal input is analog or digital.

3. The method of claim 1, wherein there are multiple audio signals, and a separate time-varying time delay is introduced into each signal.

4. The method of claim 3, wherein the modified audio signals are output to headphones.

5. The method of claim 3, wherein the modified audio signals are output to in-ear receivers or earbuds.

6. The method of claim 3, wherein the modified audio signals are output to a hearing aid device.

7. An apparatus for processing multiple audio signals, comprising:

one or more audio processors, each of said processors introducing a random time-varying time delay or phase shift into an audio signal received by said audio processor emulating relative motion between a source and a listener.

8. The apparatus of claim 7, wherein the time delay is produced by one or more pure-delay devices.

9. The apparatus of claim 8, wherein the pure-delay device is a charge-coupled delay line.

10. The apparatus of claim 9, wherein the delay time is adjusted by varying the clock rate of the delay line.

11. The apparatus of claim 7, wherein the delay time for each signal is separately controllable by voltage, current, or frequency.

12. The apparatus of claim 7, wherein the delay time for each signal is produced by introduction of an electrical phase shift.

13. The apparatus of claim 7, wherein the delay time for each signal is separately controlled by an external control parameter.

14. The apparatus of claim 13, wherein the external control parameter is generated by a random or pseudo-random process.

15. The apparatus of claim 13, wherein the external control parameter is generated by a random noise or number generators.

16. The apparatus of claim 7, wherein the delay is applied as a digital process through the use of a memory or shift register.

17. The apparatus of claim 16, wherein the timing of the delay process is generated without step discontinuity by a number generator or direct digital synthesis.

18. The apparatus of claim 16, wherein the delayed signals are converted to analog for output.

19. The apparatus of claim 18, wherein the digital-to-analog conversion is followed by low-pass reconstruction filters.

* * * * *